(12) United States Patent
Koga et al.

(10) Patent No.: US 7,385,463 B2
(45) Date of Patent: Jun. 10, 2008

(54) SURFACE ACOUSTIC WAVE DEVICE AND ELECTRONIC CIRCUIT DEVICE

(75) Inventors: Wataru Koga, Kyoto (JP); Yoshifumi Yamagata, Kyoto (JP); Shigehiko Nagamine, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 11/021,087

(22) Filed: Dec. 21, 2004

(65) Prior Publication Data
US 2005/0146397 A1 Jul. 7, 2005

(30) Foreign Application Priority Data
Dec. 24, 2003 (JP) .............................. 2003-428243
Jan. 27, 2004 (JP) .............................. 2004-019031

(51) Int. Cl.
*H03H 9/10* (2006.01)
*H03H 9/25* (2006.01)
(52) U.S. Cl. ........................................ 333/133; 333/193
(58) Field of Classification Search ................ 333/133, 333/193; 310/310 B; 257/682
See application file for complete search history.

(56) References Cited
U.S. PATENT DOCUMENTS
5,699,027 A * 12/1997 Tsuji et al. .................. 333/193

6,281,436 B1   8/2001  Gotoh et al. ................ 174/52.3
6,351,194 B2 *  2/2002  Takahashi et al. ........... 333/133
6,661,084 B1 * 12/2003  Peterson et al. ............. 257/680

FOREIGN PATENT DOCUMENTS
JP          04-293310           10/1992

* cited by examiner

*Primary Examiner*—Dean Takaoka
(74) *Attorney, Agent, or Firm*—Hogan & Hartson LLP

(57) ABSTRACT

In a surface acoustic wave device, an excitation electrode 5 in a surface acoustic wave element is provided on a lower surface of a piezoelectric substrate 3, and the lower surface of the piezoelectric substrate 3 is disposed in a state where it is opposed to an upper surface of a mounting base member 2. The surface acoustic wave device comprises a through hole 9 penetrating between the upper surface and a lower surface of the mounting base member 2, a lead electrode 10 closing the through hole 9 and formed so as to extend to the lower surface of the mounting base member 2, and an insulator 11 covering the lead electrode 10 so as to expose its partial area 16. When the surface acoustic wave device is mounted on a circuit board or the like, therefore, the through hole 9 is closed by the insulator 11, so that no bubbles are produced in the through hole 9, and cracks can be prevented from appearing, thereby making it possible to provide a highly reliable surface acoustic wave device having no inferior connection or the like.

31 Claims, 10 Drawing Sheets

SURFACE ACOUSTIC WAVE DEVICE AND ELECTRONIC CIRCUIT DEVICE

BACKGROUND OF THE INVENTION

1. Field of the Invention

The present invention relates to a surface acoustic wave device having a so-called face down structure comprising a base member and a piezoelectric substrate having a surface acoustic wave element formed on its one main surface and configured by opposing the one main surface of the piezoelectric substrate to an upper surface of the base member, and an electronic circuit device in which the surface acoustic wave device is disposed on a circuit board.

2. Description of the Related Art

In recent years, surface acoustic wave filters have been widely utilized in a communication field, and particularly are frequently used for mobile communication apparatuses. The mobile communication apparatus has evolved to a multifunctional apparatus also having functions serving as a digital camera and a radio receiver and further the function of remotely controlling home electric appliances.

In such flow, the number of devices employed for mobile communication apparatuses tends to be increased. However, the size of the mobile communication apparatus is difficult to increase from a request of the market. Therefore, it is required to reduce the size and the height of a device employed for the mobile communication apparatus.

Surface acoustic wave filters so far used for mobile communication apparatuses generally have a so-called CSP (Chip Size Package) structure mounted on ceramic substrates in a face down structure. In recent years, CSP structures using resin substrates have been proposed from reasons such as the reason that fabrication is easy.

An example of a surface acoustic wave device 1' having a CSP structure using such a resin substrate is illustrated in FIG. 16. Here, "2" denotes a mounting base member composed of a resin substrate having a through hole 9 formed therein. A lead electrode 10 having a via conductor formed in the through hole 9 is provided on a lower surface of the mounting base member 2. A connecting pad 8 and a solder bump 7 are formed in an area, where the through hole 9 is positioned, on an upper surface of the mounting base member 2, and are connected to an excitation electrode 5 formed on a lower surface of a piezoelectric substrate 3 comprising a surface acoustic wave element and a signal electrode 6 electrically connected thereto.

The surface acoustic wave element is thus mounted on the mounting base member 2 in a face down bonding structure, thereby configuring the surface acoustic wave device 1'. In the drawings, "11" denotes an insulator (a solder resist film) for preventing, when the surface acoustic wave device 1' is mounted on a circuit board, described later, through a solder, lead electrodes 10 from being short-circuited by the solder.

FIGS. 17 and 18 are cross-sectional views showing the steps of mounting the surface acoustic wave device 1' on a circuit board 15 in an electronic circuit device.

A connecting pad 12 for connection is formed on an upper surface of the circuit board 15. A solder bump 13 is formed on the connecting pad 12.

When the surface acoustic wave device 1' is mounted on the circuit board 15, portions, just below the signal electrode 6 and the connecting pad 8, of the lead electrode 10 on the lower surface of the mounting base member 2 must be positioned just above the solder bump 13, the positions where conductors on the side of the surface acoustic wave device 1', i.e., the signal electrode 6 and the connecting pad 8 are formed are limited.

When an attempt to connect the surface acoustic wave device 1' to the circuit board 15 in a state where a recess exists in the lead electrode 10 formed within the through hole 9 in the surface acoustic wave device 1', as shown in FIG. 17, the thickness of the solder bump 13 cannot be accurately controlled in mounting the surface acoustic wave device 1', so that a clearance W may easily occur on a lower surface of the insulator 11, as shown in FIG. 18. A solder in the solder bump 13 flows into the clearance W, so that the solder may be brought into contact with the other lead electrode 10 and the connecting pad 12 and short-circuited. If such short occurs, the excitation electrodes 5 are electrically connected to one another.

Furthermore, in the case of the connection by the solder bump 13, bubbles V may remain within the recess of the via conductor, as shown in FIG. 18. If water is included in the bubbles V, the water vaporizes by heat at the time of solder reflow and heat generated from the surface acoustic wave device itself at the time of application of a high power so that the bubbles V rapidly expand, which may cause some phenomena (hereinafter referred to as popcorn phenomena). For example, separation occurs between the mounting base member 2 and the piezoelectric substrate 3, and cracks appear in the lead electrode 10 and the solder bump 13 by a shock due to such rapid expansion of the bubbles V.

Consequently, the reliabilities of the surface acoustic wave device and the electronic circuit device using the same are reduced.

Furthermore, in a surface acoustic wave device comprising a plurality of surface acoustic wave elements having passbands of different frequencies, a device for preventing electromagnetic interference between the surface acoustic wave elements has been required.

An object of the present invention is to provide a versatile surface acoustic wave device having a large degree of freedom of the position where a conductor is formed and an electronic circuit device using the same.

Another object of the present invention is to provide a highly reliable surface acoustic wave device which prevents the flow of a solder to the utmost and has no problems such as inferior connection and an electronic device using the same.

Still another object of the present invention is to provide, in a surface acoustic wave device comprising a plurality of surface acoustic wave elements having passbands of different frequencies, a surface acoustic wave device being small in size and superior in isolation properties between the surface acoustic wave elements and reliability and an electronic circuit device using the same.

BRIEF SUMMARY OF THE INVENTION

A surface acoustic wave device according to the present invention comprises a base member, and a piezoelectric substrate having a surface acoustic wave element electrode formed on its main surface, and is configured by opposing the one main surface of the piezoelectric substrate to an upper surface of the base member. A recess having an opening is provided on a lower surface of the base member. A conductor pattern is formed from the inside of the recess to the lower surface of the base member in the periphery thereof. The conductor pattern is electrically connected to the surface acoustic wave element electrode through the inside of the base member. The conductor pattern is covered with an insulator so as to expose a partial area of the conductor pattern.

According to the surface acoustic wave device having such a configuration, when the surface acoustic wave device is mounted on the circuit board, an area to be covered with the insulator can be adjusted such that the partial area (exposed area) of the conductor pattern is overlapped with a connecting conductor formed on the circuit board depending on the position of the connecting conductor formed on the circuit board. Consequently, the position of the connecting conductor formed on the circuit board can be freely set. Consequently, the versatile surface acoustic wave device can be provided.

The recess may be a through hole penetrating between the upper surface and the lower surface of the base member.

The insulator may be used to fill the recess so as to come into contact with a surface of the conductor pattern formed inside the recess. According to the configuration, the recess is formed on the lower surface of the base member, the conductor pattern is formed from the inside of the recess to the lower surface of the base member in the periphery thereof, and the recess formed in the conductor pattern is filled with the insulator. When the surface acoustic wave device is disposed on the circuit board, therefore, the connecting conductor such as a melted solder does not flow into the recess. Consequently, no bubbles are produced in the recess. This allows a popcorn phenomenon to be made nil, thereby making it possible to prevent damage to the lead electrode in the surface acoustic wave device to the utmost.

Since no bubbles are produced in the recess, it is possible for the conductor in the recess from oxidizing and corroding. Further, no foreign matter such as dust or dirt enters the recess in cases such as a case where the surface acoustic wave device is moved.

As described in the foregoing, when the surface acoustic wave device is mounted on the circuit board in the electronic circuit device, it is possible to also eliminate inferior contact and corrosion by dust or dirt, etc. Therefore, there can be provided a highly reliable surface acoustic wave device.

The electronic circuit device according to the present invention is configured by disposing the surface acoustic wave device on the circuit board, there the exposed partial area of the conductor pattern is joined to a connecting conductor formed on the circuit board.

According to the electronic circuit device, an area where the conductor pattern in the surface acoustic wave device is covered with the insulator can be suitably set depending on a predetermined position of the connecting conductor formed on the circuit board. That is, the area to be covered with the insulator can be adjusted such that the exposed partial area (exposed area) of the conductor pattern is overlapped with the connecting conductor formed on the circuit board. Consequently, the degree of freedom of the position of the connecting conductor formed on the circuit board is increased, thereby making it possible to provide a versatile electronic circuit device.

It is preferable that the connecting conductor comprises a connecting pad formed on the circuit board and a solder formed on the connecting pad, and the insulator is interposed between the connecting pad and the conductor pattern formed on the lower surface of the base member. According to the electronic circuit device having this configuration, it is possible to prevent the solder formed on the connecting pad from being melted to flow out to directly come into contact with the conductor pattern. Consequently, it is possible to prevent the conductors to be insulated from being short-circuited. The insulator can be prevented from being stripped to the utmost. Further, it is possible to prevent water and air from entering from a portion between the circuit board and the insulator to the utmost and to eliminate oxidation corrosion and appearance of the popcorn phenomenon, thereby making it possible to provide a highly reliable circuit device.

A surface acoustic wave device according to the present invention comprises a base member, and a piezoelectric substrate having a surface acoustic wave element electrode formed on its main surface, and is configured by opposing the one main surface of the piezoelectric substrate to an upper surface of the base member. The surface acoustic wave element electrode formed on the one main surface of the piezoelectric substrate comprises a plurality of surface acoustic wave element electrodes having passbands of different frequencies, a first annular electrode surrounding the plurality of surface acoustic wave element electrodes is provided on the one main surface of the piezoelectric substrate, and a second annular electrode joined to the first annular electrode is provided at a position, corresponding to the first annular electrode, on the upper surface of the base member. The second annular electrode is grounded.

According to the surface acoustic wave device, a plurality of surface acoustic wave element electrodes having passbands of different frequencies and the first annular electrode surrounding the plurality of surface acoustic wave element electrodes are provided on the one piezoelectric substrate, and a second annular electrode joined to the first annular electrode is provided on the base member, thereby making it possible to provide a microminiature and low-height surface acoustic wave device. The first annular electrode surrounding the plurality of surface acoustic wave element electrodes and the second annular electrode allow the plurality of surface acoustic wave elements from being shut off from external noise by grounding the first and second annular electrodes. Consequently, there can be provided a highly reliable surface acoustic wave device.

If the first annular electrode is formed so as to individually surround each of the plurality of surface acoustic wave element electrodes, the plurality of surface acoustic wave filters having passbands of different frequencies can be formed with mutual isolation properties kept good.

In this case, if the second annular electrode is compound of a plurality of annular electrodes opposing with the first annular electrodes surrounding each of the surface acoustic wave element electrodes, the isolation properties of the surface acoustic wave elements are further improved.

If the second annular electrode joined to the first annular electrode provided on the one main surface of the piezoelectric substrate is provided on the upper surface of the base member, it is possible to sufficiently ensure hermeticity and moisture resistance of a space surrounded by the first and second annular electrodes.

If the second annular electrode is formed so as to be wider than the first annular electrode, when the piezoelectric substrate is mounted on the upper surface of the base member, reliable connection between the electrodes can be realized even if the position thereof is slightly shifted. The effective thickness of a connection between the first and second annular electrodes is increased, thereby making it possible to provide a surface acoustic wave device being superior in hermeticity and moisture resistance.

If an electrode joined to the signal electrode in the surface acoustic wave element provided on the one main surface of the piezoelectric substrate is provided on the upper surface of the base member, and the electrode is formed so as to be wider than the signal electrode, when the piezoelectric substrate is mounted on the upper surface of the base member, reliable connection between the electrodes can be realized even if the position thereof is slightly shifted.

If inert gas is put into a space surrounded by the one main surface of the piezoelectric substrate, the upper surface of the base member, the first and second annular electrodes, to hermetically seal the space, a spark phenomenon which appears in the signal electrode can be prevented to the utmost when a relatively high power is applied to the surface acoustic wave element. To describe the advantage of sealing the inert gas, the space has been conventionally filled with air. In this case, when a power which is not less than a relatively high power (a power of approximately 1 W which is generally used at a CDMA (Code Division Multiple Access) portable terminal) is applied, a portion between electrode fingers composing the signal electrode is short-circuited, so that some problems arise. For example, the electrode is fused by a short-circuit current produced by the short-circuit, and a spark for blowing away not only the signal electrode but also the piezoelectric substrate occurs. If the inert gas is put into the space to hermetically seal the space, the portion between the electrode fingers can be prevented from being short-circuited.

The surface acoustic wave device can contain the plurality of surface acoustic wave elements having passbands of different frequencies with mutual isolation properties kept good. Therefore, a filter of a duplexer may be suitably configured particularly by each of the surface acoustic wave elements.

In the foregoing, the configuration was described wherein a plurality of surface acoustic wave element electrode having passbands of different frequencies and the first annular electrode surrounding the plurality of surface acoustic wave element electrodes are provided on the one piezoelectric substrate, and a second annular electrode joined to the first annular electrode is provided on the base member. However, in another aspect of the present invention, a plurality of surface acoustic wave element electrode having different passbands may be provided on a different piezoelectric substrate, and first annular electrodes surrounding each of the acoustic wave element electrodes may be provided, and second annular electrodes may be disposed on the upper surface of the base member at opposing positions to the first annular electrodes so as to join the first annular electrodes. The base member may be one body or separated bodies in respect of the plurality of the surface acoustic wave element electrodes. In such configurations the same effect can be obtained.

Furthermore, according to the electronic circuit device and the communication device comprising such a surface acoustic wave device, it is possible to realize a highly sensitive and reliable and small-sized and low-height electronic circuit device and communication device.

In the electronic circuit device comprising the surface acoustic wave device, it is preferable that phase matching means for matching the phases of signals passing through the plurality of surface acoustic wave elements is provided on the circuit board. According to this configuration, the surface acoustic wave device does not contain the phase matching means, thereby making it possible to reduce the mounting area and the number of laminations in the surface acoustic wave device. Therefore, there can be provided a microminiature and low-height electronic circuit device having passbands of different frequencies.

The foregoing and other objects, features, aspects and advantages of the present invention will become more apparent from the following detailed description of the present invention when taken in conjunction with the accompanying drawings.

DETAILED DESCRIPTION OF THE INVENTION

Embodiments of a surface acoustic wave device according to the preset invention will be described in detail while referring to schematic drawings.

First Embodiment

Figure 1:
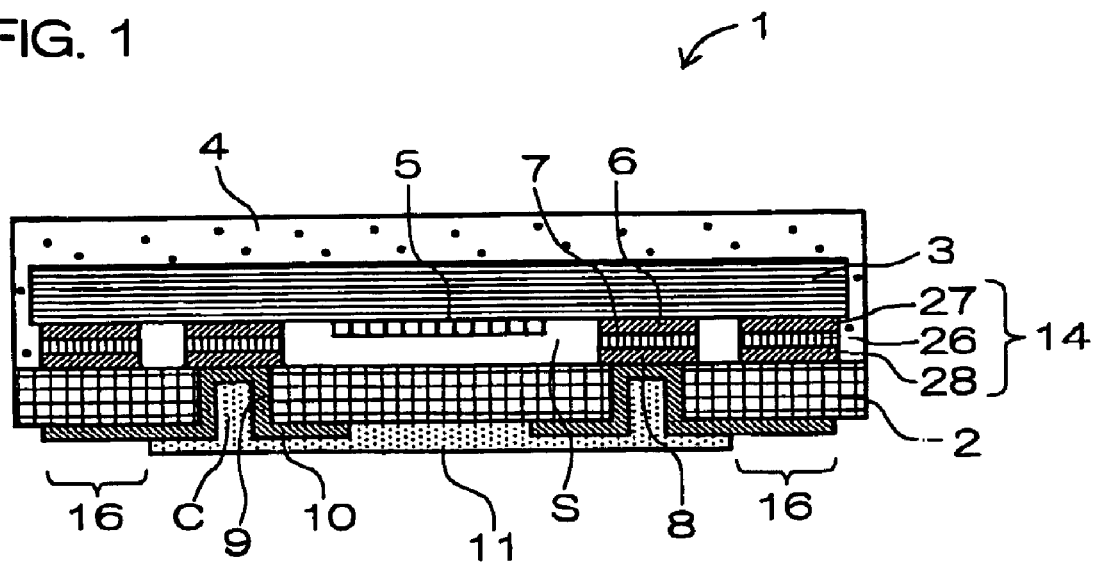
FIG. 1 is a cross-sectional view showing an embodiment of a surface acoustic wave device according to the present invention.
Figure 2:
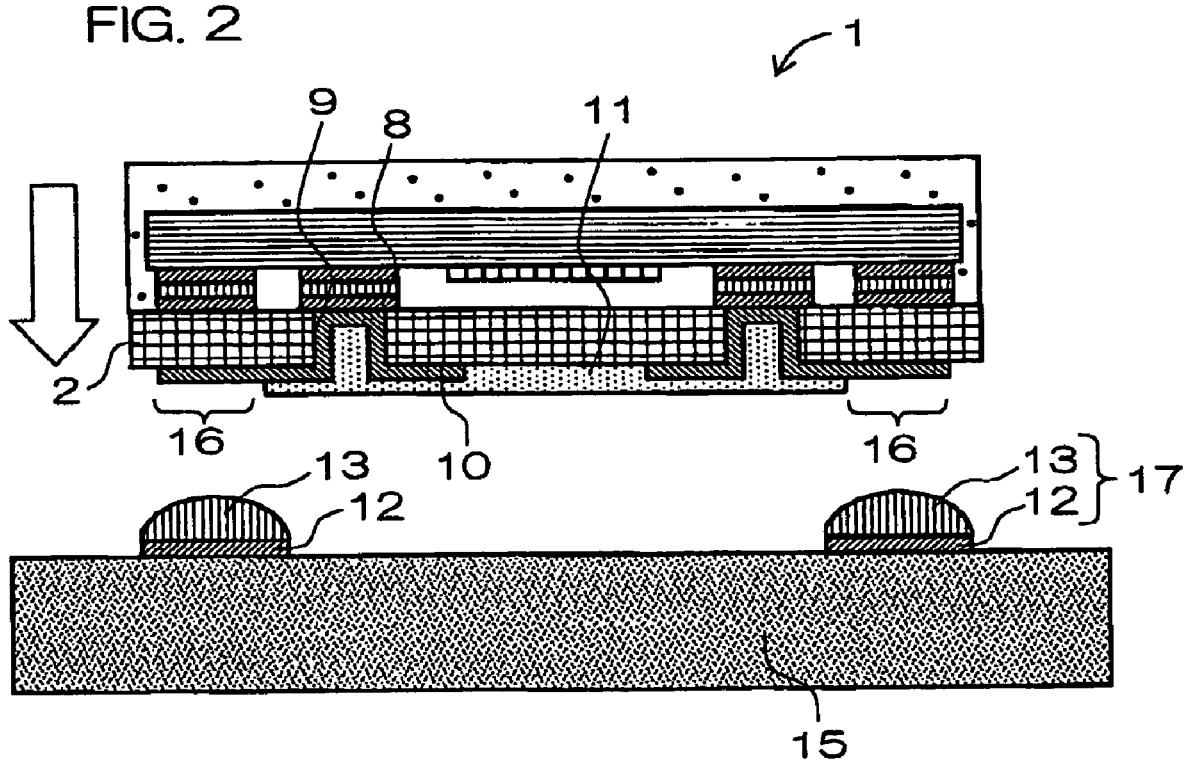
FIG. 2 is a cross-sectional view showing the steps of mounting the surface acoustic wave device shown in FIG. 1 on a circuit board in an electronic circuit device.
Figure 3:
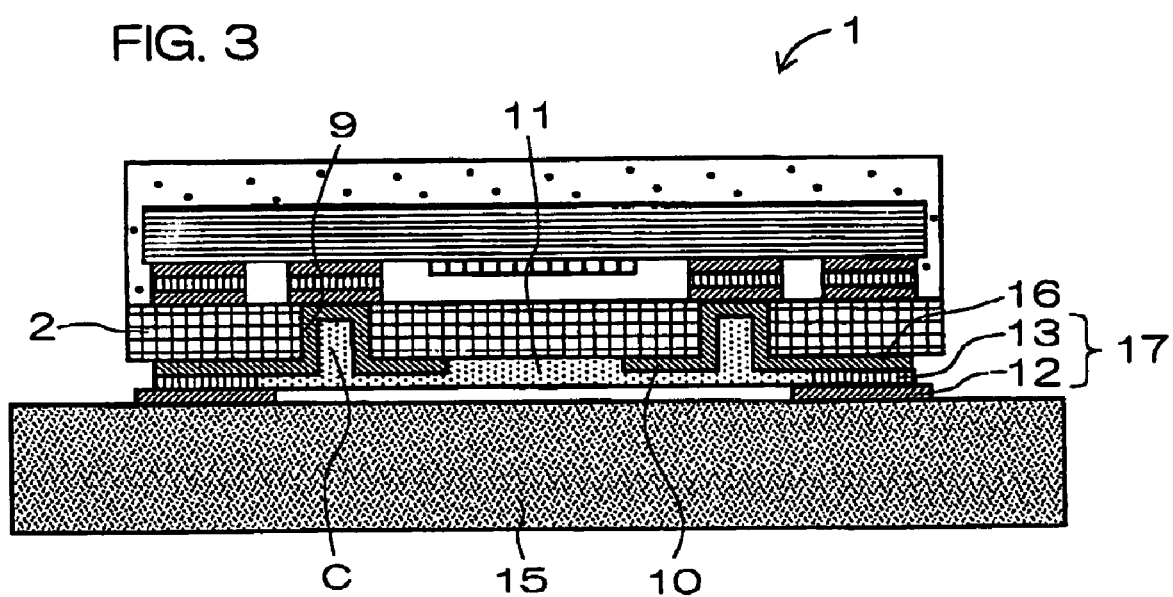
FIG. 3 is a cross-sectional view showing an example of an electronic circuit device in which the surface acoustic wave device shown in FIG. 1 is mounted on a circuit board.

FIG. 1 is a cross-sectional view showing a surface acoustic wave device 1 according to the present invention. FIGS. 2 and 3 are cross-sectional views showing the steps of mounting the surface acoustic wave device 1 on a circuit board 15 in an electronic circuit device to configure the electronic circuit device.

As shown in FIG. 1, the surface acoustic wave device 1 comprises a piezoelectric substrate 3 and a mounting base member 2.

An excitation electrode 5 formed of an IDT (Inter Digital Transducer) electrode and a signal electrode 6 connected to the excitation electrode 5 (the connected state is not illustrated because of a cross-sectional view) are formed on one main surface of the piezoelectric substrate 3. The piezoelectric substrate 3, the excitation electrode 5, and the signal electrode 6 form a surface acoustic wave element. The excitation electrode 5 and the signal electrode 6 are generically referred to as a "surface acoustic wave element electrode".

A connecting pad 8 is formed at a position, corresponding to the signal electrode 6, on an upper surface of the mounting base member 2.

The signal electrode 6 and the connecting pad 8 are connected to each other through a solder bump 7 composed of a material such as a leadless solder. Consequently, a surface, where the surface acoustic wave element electrode is formed, of the piezoelectric substrate 3 enters a state where it is opposed to the upper surface of the mounting base member 2 with a space S interposed therebetween.

A through hole 9 penetrating between the upper surface and the lower surface of the mounting base member 2 is formed at a position, where the connecting pad 8 is formed, of the mounting base member 2.

A lead electrode 10 is formed of a conductor pattern in an inner wall surface of the through hole 9, an opening surface in contact with the connecting pad 8 on an upper surface of the through hole 9, and an area, around the through hole 9, on the lower surface of the mounting base member 52. The lead electrode 10 is electrically connected to the signal electrode 6 through the connecting pad 8 and the solder bump 7.

The lead electrode 10 is not for completely closing the through hole 9 to form a recess C opened toward the lower surface of the mounting base member 2, as shown in FIG. 1.

Furthermore, an insulator 11 composed of a solder resist or the like is formed so as to be embedded in the recess C on the lower surface of the mounting base member 2. The insulator 11 covers the lead electrode 10 formed in the area, around the through hole 9, on the lower surface of the mounting base member 2. However, the insulator 11 does not cover the whole of the lead electrode 10. There is an exposed portion, which is not covered with the insulator 11, of the lead electrode 10. The exposed portion of the lead electrode 10 is a "connecting pad 16" connected to a connection electrode (described later) in a circuit board 15 on which the surface acoustic wave device 1 is to be mounted.

As described in the foregoing, the periphery of the surface acoustic wave element is hermetically sealed with a protective cover 4 composed of sealing resin in a state where the piezoelectric substrate 3 on which the surface acoustic wave element electrode is formed and the mounting base member 2 are joined to each other. This completes the surface acoustic wave device 1.

The surface acoustic wave device 1 is configured by disposing the piezoelectric substrate 3 on the mounting base member 2 in a state where the surface acoustic wave element electrode formed on the one main surface of the piezoelectric substrate 3 is opposed to the upper surface of the mounting base member 2.

The surface acoustic wave device 1 comprises a through hole 9 penetrating between the upper surface and the lower surface of the mounting base member 2, the lead electrode 10 formed on the lower surface of the mounting base member 2, and the insulator 11 for covering the lead electrode 10 so as to expose its partial area (an area of the connecting pad 16).

Materials for respective members composing the surface acoustic wave device 1 and a method of fabricating the surface acoustic wave device 1 will be described.

The piezoelectric substrate 3 is composed of a piezoelectric single crystal such as a lithium tantalate single crystal or a lithium niobate single crystal. Further, various piezoelectric materials such as a lithium tetraborate single crystal and a LANGASITE single crystal (i.e., a lanthanum-gallium-niobium system single crystal) are applicable in addition to the above-mentioned materials.

The mounting base member 2 must be easy to fabricate, lightweight, and able to be easily cut. Therefore, the mounting base member 2 is formed of a resin substrate, a silicon single crystal substrate, or an inorganic material substrate composed of alumina or ceramics such as LTCC (Low-Temperature Co-fired Ceramics). Particularly when the resin substrate is used for the mounting base member 2, there are merits. For example, the mounting base member 2 is easy to process, and the cost thereof is low.

The mounting base member 2 formed of the resin substrate will be described in detail.

The mounting base member 2 may be composed of a plastic material such as BT resin (resin mainly composed of bismaleimide triazine), polyimide resin, epoxy resin, or glass epoxy resin having high heat resistance. The reason for this is that the resin material is superior in heat resistance and water resistance. The resin substrate is lower in cost than the ceramic substrate. There can be a surface acoustic wave device whose cost is kept down.

The connecting pad 8 formed on the upper surface of the mounting base member 2 is formed of a lamination film composed of Cr (chromium)/Ni (nickel)/Au (gold) from its lower layer to its upper layer, for example. Or it may be configured with a lamination film of Cu/Ni/Au, a single film of Ag (silver) or a single film of Cu (copper).

A method of forming the through hole 9 provided in the mounting base member 2 will be then described.

First, metal films are formed on both main surfaces of the mounting base member 2 which is a resin substrate. An electrode on one side is etched and made thinner (e.g., approximately 5 μm). This is for restraining reflection at the time of laser irradiation to make a laser light absorption coefficient better.

Thereafter, the through hole 9 having a diameter of approximately 0.1 mm is formed by drilling at a predetermined position of the mounting base member 2 using carbon dioxide gas laser, for example.

After a catalyst such as palladium is then applied to the mounting base member 2, the mounting base member 2 is subjected to electroless plating in a strong alkali solution using formalin as a reducing agent, for example. Consequently, an electroless copper-plated conductor film is formed on the inner wall surface of the through hole 9. Conductors formed on both surfaces of the mounting base member 2 through the conductor film enter an electrically conducted state.

The mounting base member 2 which is subjected to electroless copper plating is thus arranged in a plating bath composed of copper sulfate, a pyrophosphoric acid, or the like, for example, as a material to be plated on the negative side, and a copper plate is disposed on the positive side, to which a predetermined voltage is applied. Consequently, copper is deposited on a surface, which is subjected to electroless copper plating, of the mounting base member 2, to form an electrolytic copper-plated coating.

Thus, a lead electrode 10 for electrically conducting both the surfaces of the mounting base member 2 is formed.

In order to close a recess C of the lead electrode 10 formed in the through hole 9, an insulator 11 such as a solder resist film is then formed in the recess C. As a method of forming the insulator 11, a paste-shaped solder resist, for example, is printed by screen printing or the like and then, is dried.

On the other hand, an excitation electrode 5 for exciting a surface acoustic wave and a signal electrode 6 connected thereto are formed on the surface of the piezoelectric substrate 3.

An annular electrode 14 (described later) may be formed, as shown in FIG. 1, so as to surround the excitation electrode 5. If the annular electrode is formed, the excitation electrode 5 and the signal electrode 6 can be hermetically sealed when the mounting base member 2 and the piezoelectric substrate 3 are joined to each other, thereby making it possible to further enhance the reliability of the surface acoustic wave device 1.

The excitation electrode 5 is composed of a single structure of Al (aluminum) or an Al—Cu alloy, a laminated structure of an Al—Cu—Mg alloy and Ti, and a laminated structure of an Al—Cu alloy and Ti, or the like, for example. The signal electrode 6 is composed of the same material as that for the excitation electrode 5, or Al, Au, Ag, Cu, Ni, Cr, Mg, or an alloy mainly composed of the materials, or a laminated structure of materials selected from the above metals for a reason for reducing a connection loss.

The excitation electrode 5 and the signal electrode 6 are formed on the surface of the piezoelectric substrate 3 using a thin film forming method such as a sputtering method, an evaporation method, or a CVD (Chemical Vapor Deposition) method, and a photolithographic method using a step-and-repeat reduced projection exposure apparatus (stepper), and etching using an RIE (Reactive Ion Etching) apparatus.

When the excitation electrode 5 and the signal electrode 6 are formed, the piezoelectric substrate 3 and the mounting base member 2 are joined to each other by the solder bump 7, and the periphery of the surface acoustic wave element is hermetically sealed with the protective cover 4 composed of a material such as thermosetting resin (epoxy-, silicone-, phenol-, polyimide-, polyurethane-based resin), thermoplastic resin (polyphenylene sulfide, etc.), ultraviolet curing resin, or a low-melting glass, thereby completing the surface acoustic wave device 1.

As shown in FIG. 2, the surface acoustic wave device 1 is then mounted on a circuit board 15 in an electronic circuit device.

A connecting pad 12 for connection is formed on an upper surface of the circuit board 11. A solder bump 13 is formed on the connecting pad 12. The connecting pad 12 and the solder bump 13 are generically referred to as a "connecting conductor 17".

When the surface acoustic wave device 1 is mounted on the circuit board 15, the above-mentioned exposed partial area (the connecting pad 16), which is not covered with the insulator 11, of the lead electrode 10 is brought into contact with the solder bump 13.

Thereafter, a solder is melted by applying heat, to fasten the connecting pad 16 onto the connecting pad 12. The surface acoustic wave device 1 can be thus mounted on the circuit board 15, thereby fabricating an electronic circuit device.

According to the surface acoustic wave device 1 and the electronic circuit device, the connecting pad 16 in the surface acoustic wave device 1 can be set to a predetermined position such that it is overlapped with the position of the connecting pad 12 formed on the circuit board 15. The position of the connecting pad 16 can be set by determining an area where the lead electrode 10 is covered with the insulator 11. That is, the area where the lead electrode 10 is covered with the insulator 11 can be set such that the position of the connecting pad 16 is overlapped with the position of the connecting pad 12 formed on the circuit board 15. Consequently, the position of the connecting pad 12 formed on the circuit board 15 can be relatively freely determined, thereby making it possible to provide the versatile surface acoustic wave device 1.

According to the electronic circuit device having this configuration, the lead electrode 10 is covered with the insulator 11 excluding an area of the connecting pad 16, as shown in FIG. 3. Even if the solder bump 13 formed on the connecting pad 12 is melted to flow out, the flow is restrained by the insulator 11. Consequently, it is possible to prevent the lead electrodes 10 from being short-circuited.

According to the surface acoustic wave device and the electronic circuit device in the present invention, the through hole 9 penetrating between the upper surface and the lower surface of the mounting base member 2, the lead electrode 10 formed on the lower surface of the mounting base member 2 so as to close the through hole 9, and the insulator 11 for covering the lead electrode 10 so as to expose its partial area are provided. The through hole 9 is closed by the insulator 11 in a state where the recess C is formed in the lead electrode 10, thereby eliminating the possibility that a connecting conductor such as a solder is melted to flow into the recess C when the surface acoustic wave device 1 is disposed on the circuit board 15. Consequently, no bubbles are produced in the recess C, thereby making it possible to make a popcorn phenomenon nil and to enhance the reliability of connection.

Since no bubbles are produced in the recess C, a conductor in the recess C can be prevented from oxidizing and corroding. Further, no foreign matter such as dust or dirt enters the recess C in moving the surface acoustic wave device 1, for example. The insulator 11 can be prevented from being stripped to the utmost.

As described in the foregoing, there can be provided a surface acoustic wave device and an electronic circuit device which are highly reliable.

EXAMPLES

Specific examples of the present invention will be described while referring to the drawings.

The surface acoustic wave device shown in FIG. 1 was fabricated.

An Al (99 mass %)-Cu (1 mass %) IDT electrode pattern, an input-output electrode pattern, and a wiring pattern for electrically connecting them were formed on the piezoelectric substrate 3 which is a 38.7° Y-cut X-direction propagation lithium tantalate single crystal substrate.

A lithium tantalate wafer which is a substrate material was first ultrasonically cleaned by an organic solvent such as acetone or IPA (isopropyl alcohol), to clean an organic component. The substrate was then sufficiently dried by a clean oven.

In film formation of the electrode, a sputtering apparatus was employed, to form an Al—Cu film having the above-mentioned composition, a photoresist was then spin-coated to a thickness of approximately 0.5 μm, and the excitation electrode 5 was exposed to a desired electrode pattern by a stepper. Simultaneously, the input-output electrode 6 was exposed.

The photoresist in an unnecessary portion was then melted using an alkali developing solution by a developing apparatus, to express a desired electrode pattern, and the electrode was then etched by an RIE apparatus, to obtain a desired electrode pattern.

Thereafter, a protective film was produced. That is, silicon oxide ($SiO_2$) was film-formed by a sputtering apparatus, a resist was then patterned by photolithography, and a window opening portion for the signal electrode 6 and a window opening portion for the annular electrode 14 were etched by an RIE apparatus or the like, to form a protective film having a predetermined pattern.

Next, a laminated film of Cr/Ni/Au was formed from bottom to upper, on the window opening portion for the signal electrode 6 and the annular electrode 14. The laminated film functions to secure wettability with solder when mounting the device on the base member 2, and to prevent the joining portion from being large electric resistance and from being fragile, by stopping solder diffusion to the under Au—Cu layer.

A piezoelectric substrate was then diced along a dicing line and divided for each chip.

A solder paste composed of a leadless solder was subjected to screen printing on divided pieces thus obtained, and was reflowed, to form a solder bump, and was joined to a BT resin substrate. Thereafter, a surface acoustic wave element was sealed with sealing resin 4, and was then diced for each piece, to obtain the surface acoustic wave device 1.

The positional relationship between the pattern of a reverse surface electrode composed of Cu formed on the mounting base member 2 which is a resin substrate and the pattern of an insulator which is a solder resist film composed of polybenzoxazole polyimide resin will be described in detail.

Figure 4:
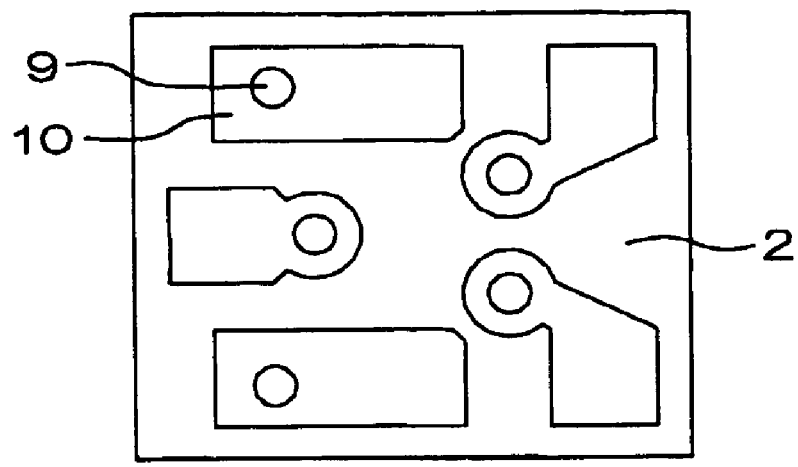
FIGS. 4 to 6 are plan views showing a reverse surface of a base member in the surface acoustic wave device according to the present invention.
Figure 5:
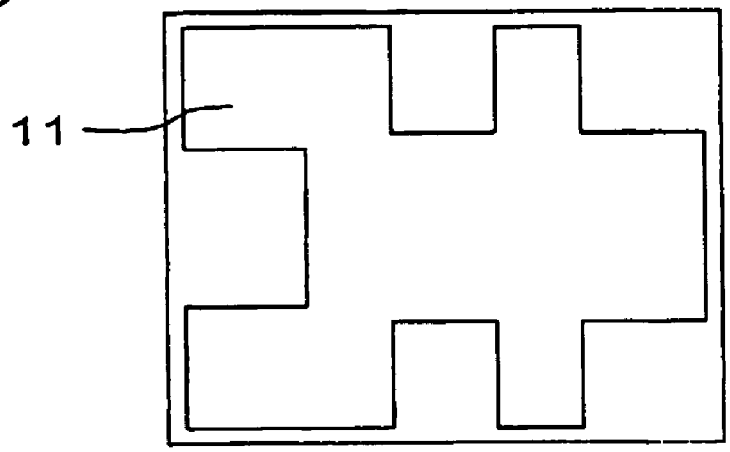
Figure 6:
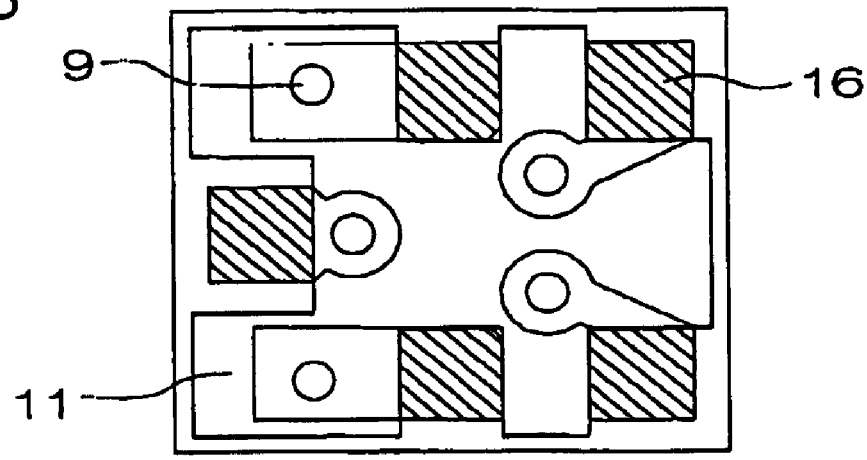

FIGS. 4 to 6 are plan views showing a reverse surface of the resin base member 2. FIG. 4 illustrates the positions of the lead electrode 10 and the through hole 9. FIG. 5 illustrates the shape of the insulator 11 which is a solder resist film.

FIG. 6 is a diagram showing a pattern which is an overlapping of FIGS. 4 and 5, which illustrates the connecting pad 16 by diagonal hatching. The positional relationship between the through hole 9 and the connecting pad 16 in the present invention is specifically illustrated in FIG. 6.

As shown in FIG. 6, the through hole 9 is covered with the insulator 11 by a screen printing process, and the connecting pad 16 composed of Cu is exposed in a conductive portion having no insulator 11.

In this configuration, the through hole 9 is completely closed by the insulator 11, thereby eliminating the possibility that when the surface acoustic wave device 1 is joined to the circuit board 15 by a solder, the solder enters the recess C in the through hole 9 to produce bubbles.

Figure 7:
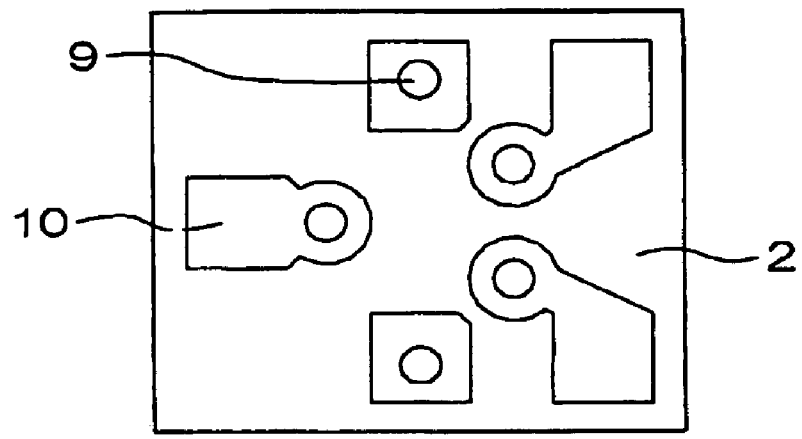
FIGS. 7 to 9 are plan views showing a reverse surface of a base member in a surface acoustic wave device in a comparative example.
Figure 8:
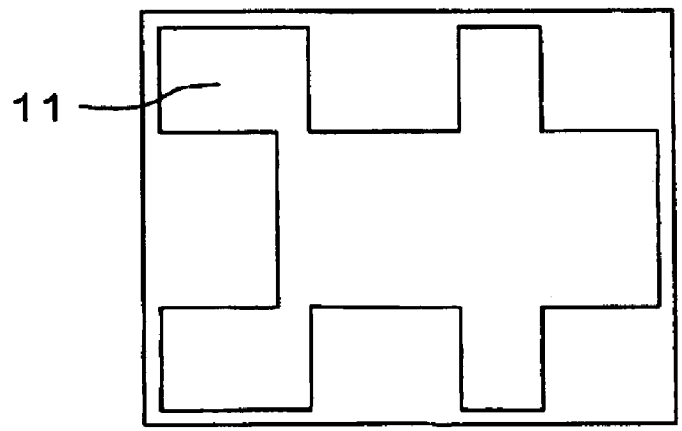
Figure 9:
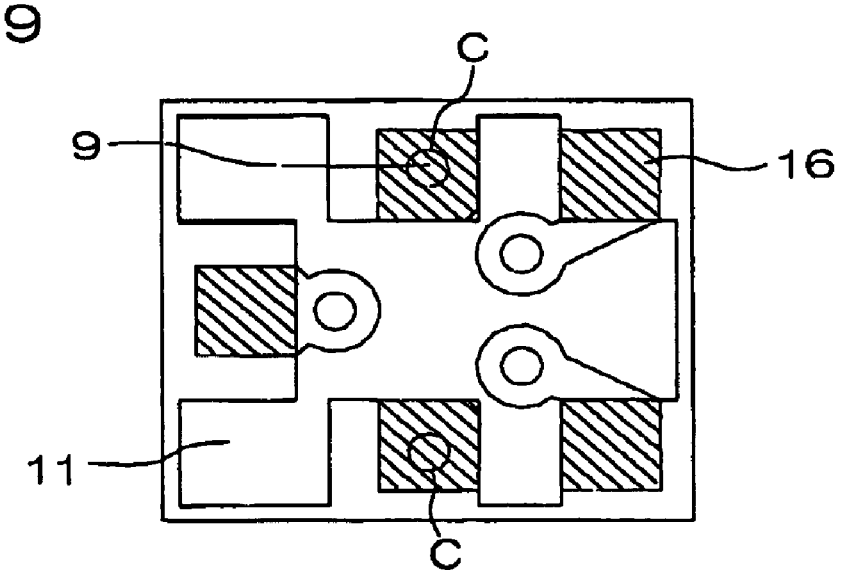

As a comparative example, a reverse surface electrode pattern and the pattern of an insulator 11 which is a solder resist film are illustrated in FIGS. 7 to 9.

FIG. 7 illustrates the positions of the lead electrode 10 and the through hole 9. FIG. 8 illustrates the shape of the insulator 11.

FIG. 9 is an overlapping of FIGS. 7 and 8. As shown in FIG. 9, in the configuration of the comparative example, the recess C in the through hole 9 enters a state where it is exposed to the connecting pad 16. When the surface acoustic wave device 1 is joined to the circuit board 15 by a solder, bubbles may, in some cases, remain within the recess C.

Thus, it is possible to confirm that a popcorn phenomenon which has appeared when the surface acoustic wave device 1 is mounted on the circuit board 15 is restrained in this example. Consequently, there can be provided a surface acoustic wave device and an electronic circuit device which are highly reliable.

Second Embodiment

A surface acoustic wave device according to another embodiment of the present invention will be described in detail while referring to the drawings.

Figure 10:
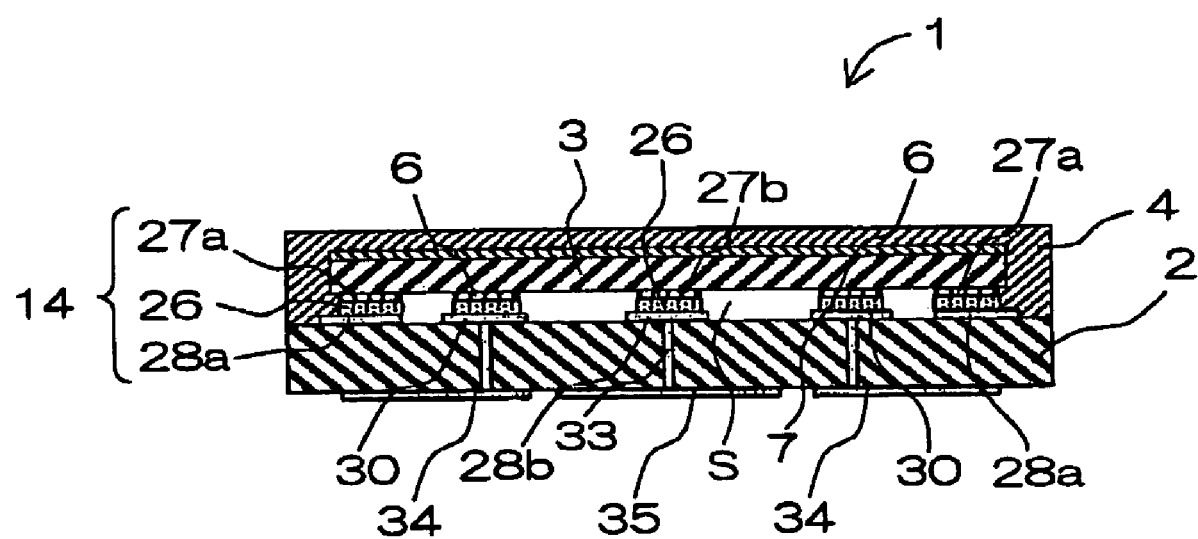
FIG. 10 is a cross-sectional view showing another embodiment of the surface acoustic wave device according to the present invention.
Figure 11:
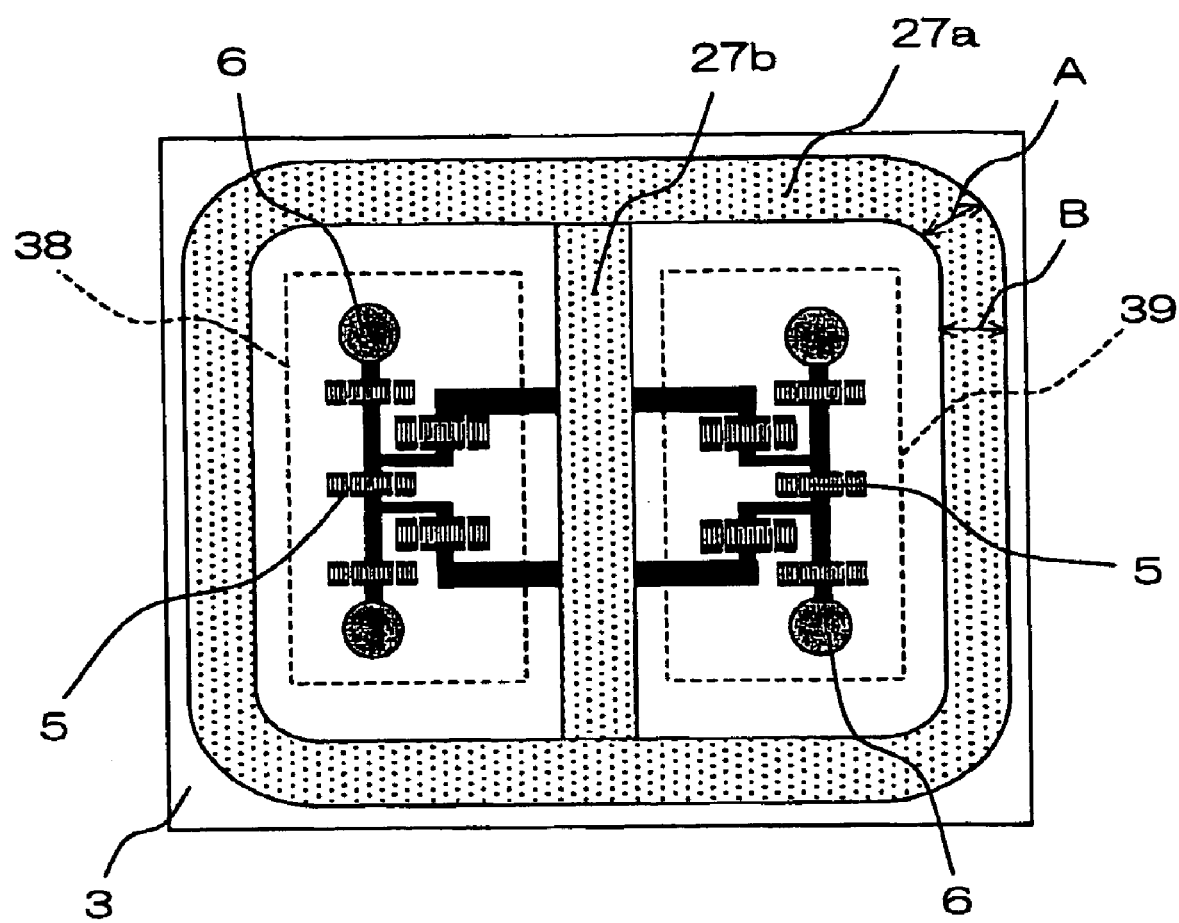
FIG. 11 is a plan view of the shape of an electrode formed on a piezoelectric substrate in the surface acoustic wave device.

FIG. 10 is a cross-sectional view showing a mounting structure of a surface acoustic wave device according to the present invention. FIG. 11 is a plan view of an electrode structure of a surface acoustic wave element provided in a piezoelectric substrate 3 in the surface acoustic wave device.

Figure 12:
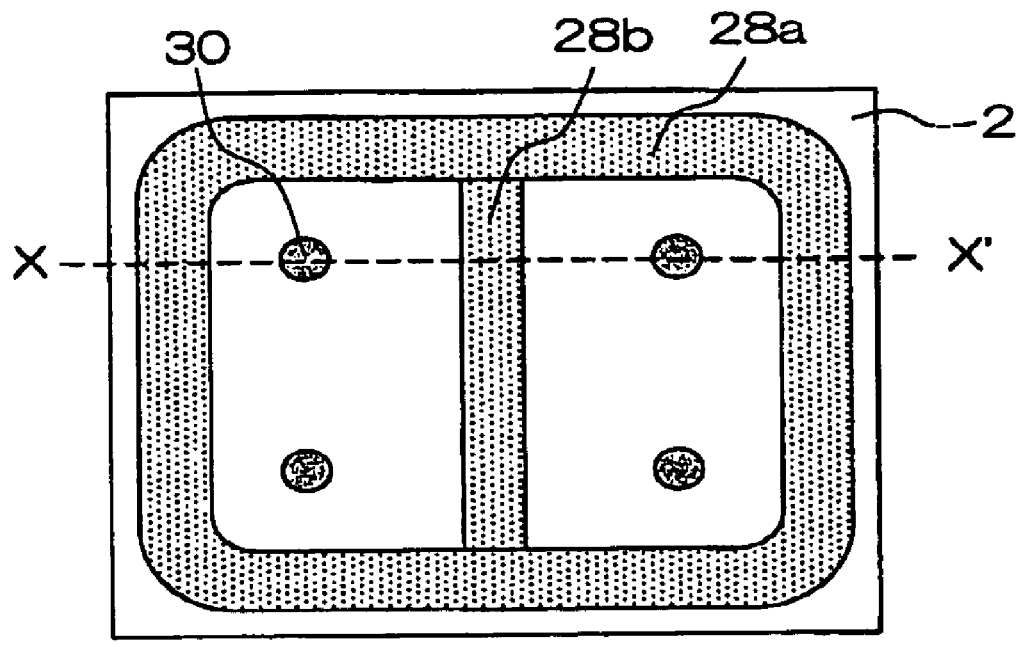
FIG. 12 is a plan view showing an electrode formed on an upper surface of a mounting base member in the surface acoustic wave device.
Figure 13:
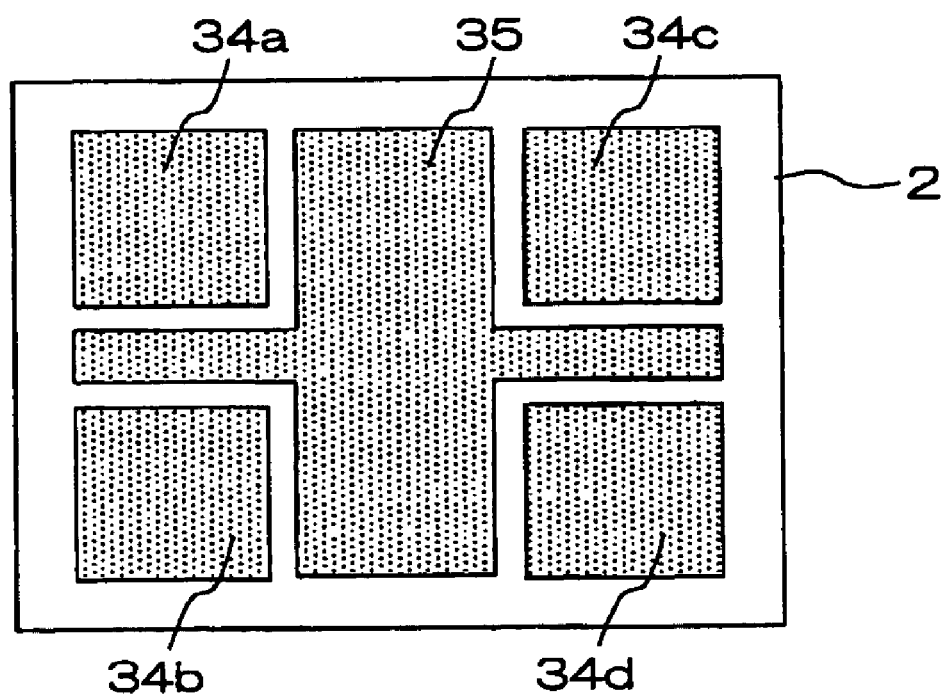
FIG. 13 is a plan view showing an electrode formed on a reverse surface of a mounting base member in the surface acoustic wave device.

FIGS. 12 and 13 respectively illustrate an electrode structure on the side of a surface of a mounting base member 2 and an electrode structure on the side of a reverse surface of the mounting base member 2. The mounting base member 2 shown in FIG. 10 is illustrated in a cross-sectional view taken along a line X-X' shown in FIG. 12.

As shown in FIGS. 10 and 11, in the surface acoustic wave device according to the present invention, a plurality of surface acoustic wave element electrodes (38 and 39 shown in FIG. 11) having passbands of different frequencies are formed on the piezoelectric substrate 3. The two surface acoustic wave element electrodes 38 and 39 are formed in a divided manner on the piezoelectric substrate 3 in order to improve isolation.

Each of the surface acoustic wave element electrodes 38 and 39 comprises a piezoelectric substrate 3, an excitation electrode 5, formed on the piezoelectric substrate 3, serving as an IDT (Inter Digital Transducer) electrode, and a signal electrode 6 connected thereto. An annular electrode 27*a* surrounding the whole of the surface acoustic wave element electrodes 38 and 39 is provided on the piezoelectric substrate 3, and a strip-shaped separation electrode 27*b* is provided between the surface acoustic wave element electrode 38 and the surface acoustic wave element electrode 39. The annular electrode 27*a* and the separation electrode 27*b* are generically referred to as "first annular electrodes 27*a* and 27*b*".

Furthermore, the first annular electrodes 27*a* and 27*b* are formed so as to individually surround each of the plurality of surface acoustic wave element electrodes 38 and 39.

An input-output electrode 30 is formed at a position opposite to the signal electrode 6 on the piezoelectric substrate 3, as shown in FIG. 12, on the upper surface of the mounting base member 2. Second annular electrodes 28*a* and 28*b* are formed at positions opposite to the first annular electrodes 27*a* and 27*b* on the piezoelectric substrate 3. The second annular electrodes 28*a*, 28*b* are connected to a ground level.

It is desirable that the input-output electrode 30 on the mounting base member 2 is larger than the signal electrode 6 on the piezoelectric substrate 3. It is desirable that the second annular electrodes 28*a* and 28*b* on the mounting base member 2 are wider than the first annular electrodes 27*a* and 27*b* on the piezoelectric substrate 3.

The second annular electrodes 28*a* and 28*b* may extend outward from areas corresponding to the surface acoustic wave element electrodes 38 and 39 on the mounting base member 2. The electrode on the mounting base member 2 is thus made larger than the electrode on the piezoelectric substrate 3 joined thereto, thereby making it possible to prevent inferior conduction or the like from occurring even when there occurs mounting deviation between both the substrates.

A surface, on which the surface acoustic wave element electrode is carried, of the piezoelectric substrate 3 is opposed to the upper surface of the mounting base member 2, to join the signal electrode 6 on the piezoelectric substrate 3 and the input-output electrode 30 on the mounting base member 2 to each other by a solder bump 7 and to join the first annular electrodes 27a and 27b on the piezoelectric substrate 3 and the second annular electrodes 28a and 28b on the mounting base member 2 to each other by a solder bump 26.

The solder bumps 7 and 26 are referred to as "conductive members".

The annular electrode 27a on the piezoelectric substrate 3, the annular electrode 28a on the mounting base member 2, and the solder bump 26 are referred to as an "annular electrode 14".

The first annular electrodes 27a and 27b on the piezoelectric substrate 3 and the second annular electrodes 28a and 28b on the mounting base member 2 are formed so as to individually surround each of the plurality of surface acoustic wave element electrodes, thereby making it possible to form a closed space S surrounded by the first annular electrodes 27a and 27b, the second annular electrodes 28a and 28b, the piezoelectric substrate 3, and the mounting base member 2.

Inert gas (nitrogen or rare gas (gas composed of a 18-group element such as argon, etc.)) is put into the space S, to hermetically seal the space S. The space S is thus hermetically sealed with the inert gas. Even when a relatively high power is applied to the excitation electrode 5, the signal electrode 6, and so on which constitute the surface acoustic wave element electrode, therefore, a spark phenomenon appearing in the excitation electrode 5 and the signal electrode 6 can be prevented to the utmost.

As a material for the piezoelectric substrate 3, a lithium tantalate single crystal described in the first embodiment, for example, can be used.

As materials for the excitation electrode 5, the signal electrode 6, and the first annular electrodes 27a and 27b which are formed on the piezoelectric substrate 3, a laminated structure of Al, an Al—Cu (copper) alloy, or an Al—Cu—Mg (magnesium) alloy and Ti (titanium) described in the first embodiment, for example, can be used.

The mounting base member 2 is also composed of a resin substrate or a LTCC, as described in the first embodiment.

As materials for an input-output electrode 30 formed on the mounting base member 2 and the second annular electrodes 28a and 28b, a lamination film composed of Cr (chromium)/Ni (nickel)/Au (gold) or the like from its lower layer to its upper layer, or a laminated layer of Cu/Ni/Au, or single layer of Ag or Cu, as described in the first embodiment, is used.

The second annular electrodes 28a and 28b formed on the mounting base member 2 are conductively connected to a ground terminal electrode 35 formed on a reverse surface of the mounting base member 2 through a via electrode 33 formed by plating of Cu, or printing of Ag (silver) or W (tungsten). The ground terminal electrode 35 is formed of the same material as that for the input-output electrode 30, or the second annular electrode 28a, 28b.

Furthermore, the signal electrode 30 is similarly conductively connected to a signal terminal electrode 34 formed on the lower surface of the mounting base member 2 through the via electrode 33. Further, the ground terminal electrode 35 exists between the signal terminal electrodes 34 so that the signal terminal electrodes 34 are not directly adjacent to one another.

In the present embodiment, the solder bump 26 is used to fill a portion between the first annular electrodes 27a and 27b and a portion between the second annular electrodes 28a and 28b to have hermeticity.

Usable as the solder bump 26 is a solder material composed of an Sn (tin)-Ag—Cu alloy, an Sn—Sb (antimony) alloy, an Sn—Zn (zinc) alloy, an Au—Sn alloy, or the like.

When the piezoelectric substrate 3 is joined to the mounting base member 2, an upper surface and a side surface of the piezoelectric substrate 3 are covered with a protective material 4 composed of epoxy resin or the like in order to prevent the solder bump 26 from flowing out. The protective material 4 covers the piezoelectric substrate 3, to prevent the surface acoustic wave element from being damaged by a shock or the like.

The protective material 4 may be composed of resin or a metal superior in hermeticity in addition to the resin. In this case, the hermeticity is kept by the protective material 4, so that the solder bump 26 does not require hermeticity. Consequently, the solder bump 26 can be also formed of a conductive paste such as an Ag paste. Of course, both the protective material 4 and the solder bump 26 may be materials superior in hermeticity.

Furthermore, the widths of the first annular electrodes 27a and 27b are approximately constant in any portion, as shown in FIG. 11. That is, the width A as illustrated of a corner (a curved portion) and the width B as illustrated of a linear portion of the annular electrode 27 are approximately equal to each other. Consequently, a solder amount can be made approximately uniform, thereby making better hermetic sealing feasible.

The above-mentioned configuration makes it possible to prevent isolation by inductive coupling between the surface acoustic wave elements wired with an Au wire, conventionally used, from being degraded, and eliminates the necessity of a clearance between a cavity and the surface acoustic wave element electrode and an electrode for connecting the Au wire.

In such a manner, there can be provided a microminiature surface acoustic wave device realizing significantly good hermetic sealing and having approximately the same shape as the surface acoustic wave element.

The shapes of a filter formed of the two surface acoustic wave elements 38 and 39 may be arbitrary. For example, a ladder-type filter, a DMS (Double Mode SAW) filter, a lattice-type filter, and so on are applicable. The filter may be a composite filter.

Furthermore, in the above-mentioned configuration, separation electrodes 27b and 28b for separating the surface acoustic wave element electrode 38 and the surface acoustic wave element electrode 39 are respectively formed on the piezoelectric substrate 3 and the mounting base member 2, and are conductively connected to each other by the solder bump 26. The separation electrodes 27b and 28b for separating the surface acoustic wave element electrodes 38 and 39 are thus formed, thereby making it possible to further improve isolation properties, as compared with those in a case where the surface acoustic wave element electrodes 38 and 39 are arranged merely apart from each other.

Further, the separation electrodes 27b and 28b can be substituted by annular electrodes each of which surrounds the surface acoustic wave element electrode 38 and the surface acoustic wave element electrode 39, respectively. In this configuration, an electrical coupling between the surface acoustic wave element electrode 38 and the surface acoustic wave element electrode 39 is reduced to further improve isolation properties.

As previously described, the surface acoustic wave element electrodes 38 and 39 are hermetically sealed with the annular electrodes 27a and 28a. Therefore, no hermeticity is required in portions of the separation electrodes 27b and 28b, and the whole areas of the separation electrodes 27b and 28b need not be filled with the solder bump 26 in the portions of the separation electrodes 27b and 28b. That is, the solder bump 26 may be discontinuous, provided that it is conducted.

When the isolation properties are not so strictly required, only the separation electrode 27b or only the separation electrode 28b may be formed.

The surface acoustic wave element electrodes 38 and 39 have passbands of different frequencies. A combination of a cellular filter in North America and a GPS (Global Positioning System) filter or a PCS (Personal Communication Services) filter, a combination of a GSM (Global System Mobile Communication) filter and a DCS (Digital Communication System) filter, and so on correspond to the passbands.

Most suitable for the application of the surface acoustic wave element electrodes 38 and 39 are filters composing a duplexer and particularly, filters used simultaneously in time among the filters. That is, the reason for this is that in a case where the filters are simultaneously used, isolation properties are most strictly required.

As described in the foregoing, the configuration of the present invention in which the isolation properties of the surface acoustic wave element electrodes 38 and 39 are enhanced is employed, thereby making a surface acoustic wave device suitable for the duplexer feasible.

Here, a method of fabricating the surface acoustic wave device will be simply described.

First, the second annular electrodes 28a and 20b and the signal electrode 30 are formed on the mounting base member 2. A cream solder (an Sn—Ag—Cu alloy, an Sn—Sb alloy, an Sn—Zn alloy, or the like is used as a solder material) serving as the solder bump 26 is formed by screen printing on the second annular electrodes 28a and 28b and the signal electrode 30, is then melted in a reflow furnace, and is then cleaned, to remove a flux component in the solder.

The mounting base member 2 and the piezoelectric substrate 3 are then opposed to each other, to respectively align the second annular electrodes 28a and 28b and the signal electrode 30 on the mounting base member 2 with the first annular electrodes 27a and 27b and the signal electrode 6 on the piezoelectric substrate 3.

The mounting base member 2 and the piezoelectric substrate 3 are then together reflowed and electrically conducted to each other. The reflow is carried out in a nitrogen atmosphere, thereby allowing the space S to be filled with nitrogen.

Here, it is desirable that the mounting base member 2 is a large-sized substrate having a lot of substrates formed therein in order to reduce the number of steps.

An epoxy resin paste, for example, is applied over the piezoelectric substrate 3, and is subjected to curing treatment, to form the protective material 4. Finally, the surface acoustic wave device is individually cut by dicing, to be completed.

As described in the foregoing, a space where the excitation electrode 5 and the signal electrode 6 exist is hermetically sealed with the inert gas, to prevent electrode fingers composing the electrode from being short-circuited as well as to prevent the electrode from being fused by a short-circuit current produced by the short-circuit to prevent a spark from occurring to the utmost.

An example of a miniaturized electronic circuit device using the above-mentioned surface acoustic wave device will be described using FIGS. 14 and 15.

Figure 14:
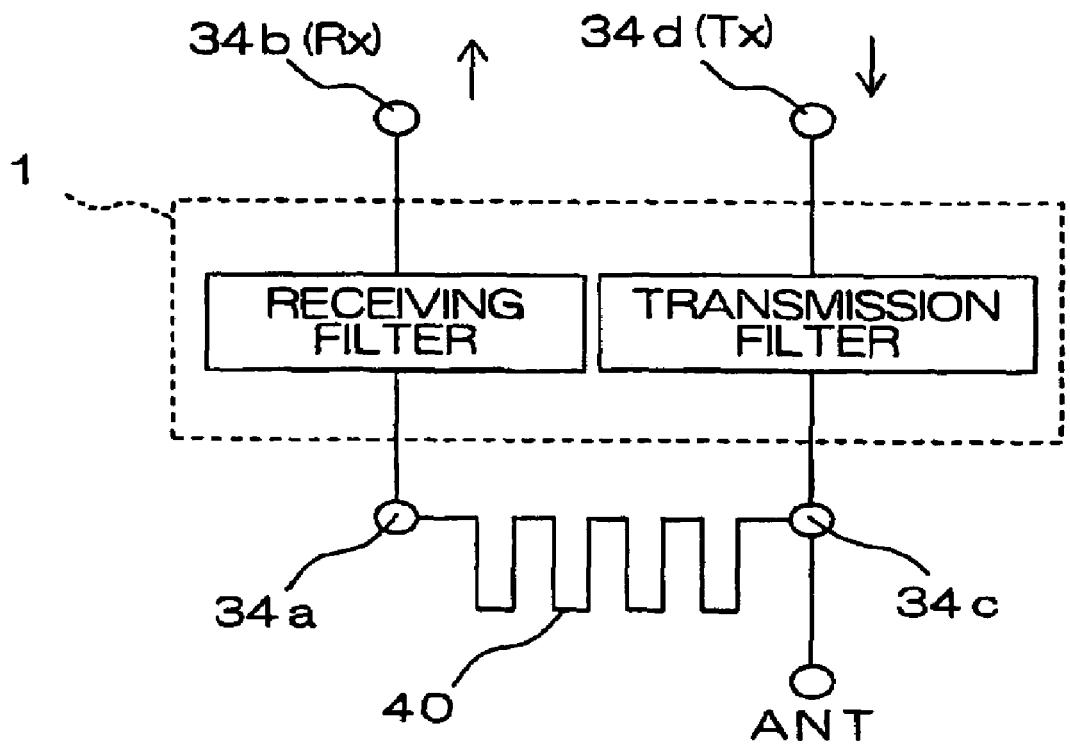
FIG. 14 is a circuit diagram of a duplexer in a case where the duplexer is realized by the surface acoustic wave device according to the present invention.

FIG. 14 is a circuit diagram of a duplexer used for the electronic circuit device.

Figure 15:
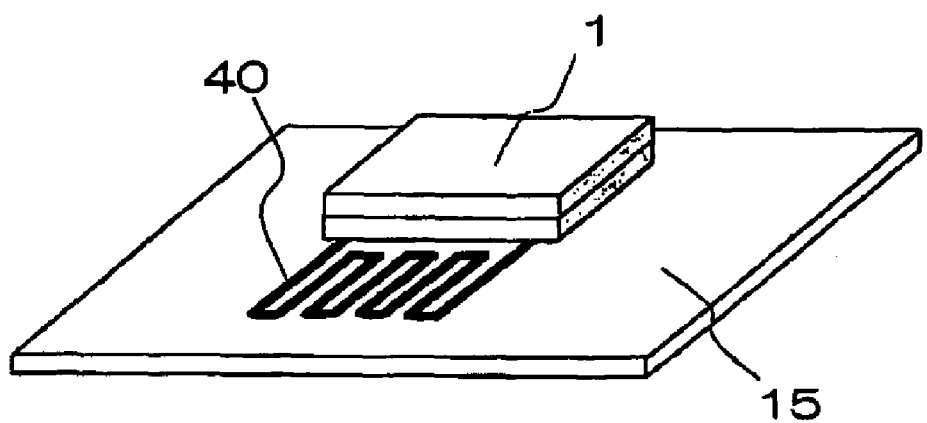
FIG. 15 is a perspective view showing an example of the electronic circuit device according to the present invention.
Figure 16:
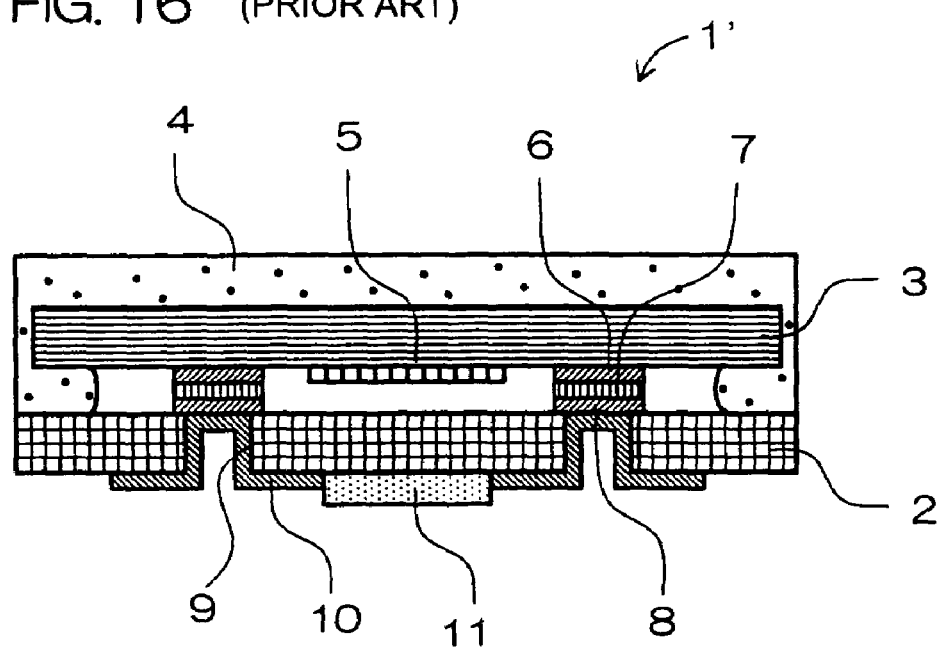
FIG. 16 is a cross-sectional view showing an example of a conventional surface acoustic wave device.
Figure 17:
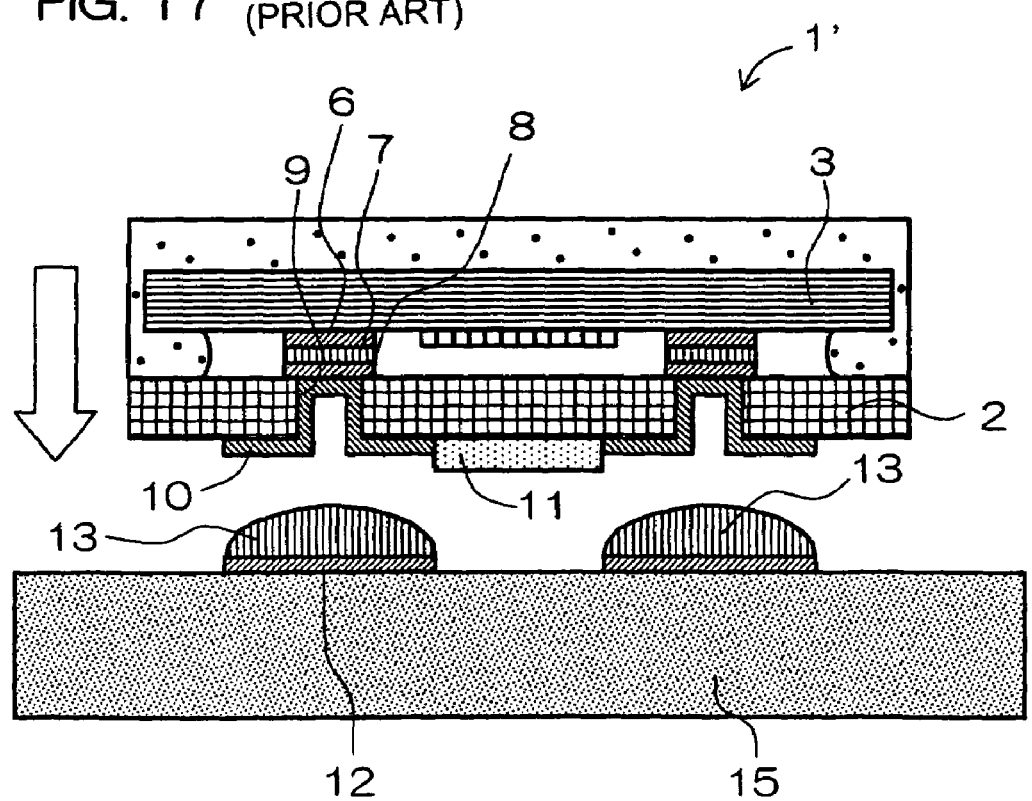
FIG. 17 is a cross-sectional view showing the steps of mounting the surface acoustic wave device shown in FIG. 16 on a circuit board.
Figure 18:
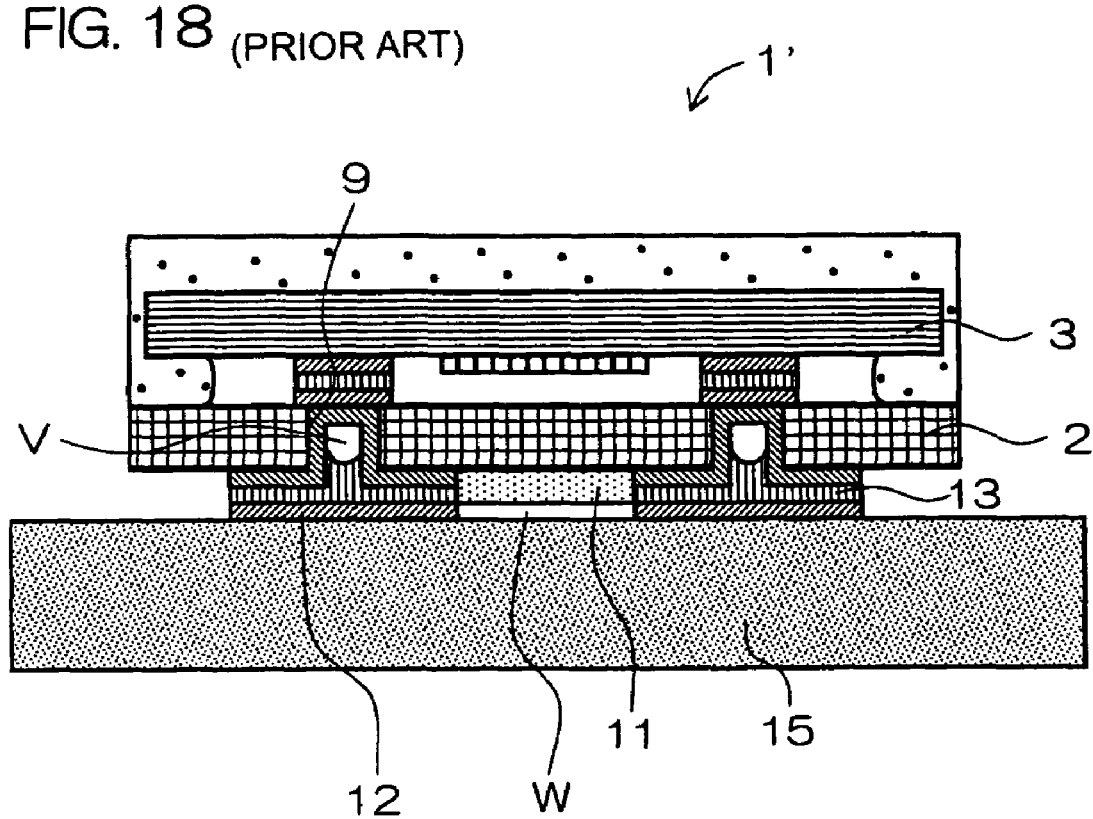
FIG. 18 is a cross-sectional view showing an example of an electronic circuit device in which the surface acoustic wave device shown in FIG. 16 is mounted on a circuit board.

FIG. 15 is a perspective view schematically showing the electronic circuit device.

Referring to FIG. 14, the duplexer is formed of a surface acoustic wave device 1 connected to an antenna terminal ANT.

The surface acoustic wave device 1 comprises two surface acoustic wave elements respectively serving as a receiving filter and a transmission filter. One of the two surface acoustic wave device elements is a surface acoustic wave element 38, described above, and the other surface acoustic wave element is a surface acoustic wave element 39, described above. A phase matching circuit (or a phase matching line) 40 serving as one of phase matching means is connected between the antenna terminal ANT and the receiving filter.

The phase matching circuit 40 is required to match the transmission filter and the receiving filter respectively having passbands of two different frequencies (a transmission frequency and a receiving frequency) without mutually degrading characteristics. The phase matching circuit 40 is composed of a meander-shaped strip line, as illustrated in FIG. 15.

In the transmission filter and the receiving filter, the phase matching circuit 40 is connected to the receiving filter because the passband of the receiving filter is set on the higher frequency side, and transmission loss is reduced in preference to the receiving loss.

The reason why the phase matching circuit 40 is inserted is that an input impedance allowing for the receiving filter from the antenna terminal ANT reaches an infinite value in the passband of the transmission filter. Specifically, when a signal inputted from a signal terminal electrode 34d (indicated by Tx) connected to a transmission circuit passes through the transmission filter, to reach a signal terminal electrode 34c, as shown in FIG. 14, the phase matching circuit 40 and the receiving filter are not apparently connected to each other. As a result, a transmission signal is outputted from an antenna without increasing the loss.

The length of the phase matching circuit 40 must be approximately one-fourth the wavelength in the frequency in the passband of the transmission filter. When a material for the mounting base member 2 is alumina, the length of the phase matching circuit 40 is approximately 30 mm in a band of 836.5 MHz.

When the phase matching circuit 40 is acquired as a meander line in the duplexer, isolation between the phase matching circuit 40 and the signal terminal electrodes 34b and 34d must be considered in addition to isolation between the filters.

Therefore, in the present embodiment, the phase matching circuit 40 is formed on the circuit board 15 which is a high-frequency module substrate on which the surface acoustic wave device 1 is mounted.

FIG. 15 illustrates an example of an electronic circuit device in which the phase matching circuit 40 is formed on the circuit board 15 which is the high-frequency module substrate on which the surface acoustic wave device 1 is mounted, and is connected to the surface acoustic is wave device 1.

Here, the circuit board 15 is a main board of a communication device such as a portable telephone, for example.

When the phase matching circuit 40 is thus formed on the circuit board 15, the area for forming the phase matching circuit 40 is required on the circuit board 15. However, the isolation is improved by the area, and the height of the surface acoustic wave device 1 can be reduced.

In the shape of the phase matching circuit 40 formed of the meander line as shown in FIG. 15, the phase matching circuit 40 can be incorporated into not a surface layer but an inner layer of the circuit board 15. This eliminates the necessity of the mounting area on the surface layer. Another component (an inductor chip component, etc.) can be also employed instead of forming the meander line on the surface layer of the circuit board 15.

The above-mentioned phase matching circuit 40 may be replaced with an impedance matching circuit comprising an inductor, a capacitor, and so on as the phase matching means, in which case the same effect can be expected. The phase matching means can be also configured without increasing the number of components by sharing an inductance and a capacitor used for a power supply circuit, a switch circuit, an electrostatic breakdown preventing circuit, and so on.

Furthermore, the signal terminal electrodes 34a and 34c may be directly connected to each other by a conductor line on the mounting base member 3, the circuit board 15 or the piezoelectric substrate 3, and an inductor and a capacitor may be connected between any one of terminals of the conductor line and a ground electrode to achieve matching.

In the electronic circuit device according to the present embodiment, a portion of the piezoelectric substrate 3 excluding the mounting base member 2 in FIG. 10 may be directly provided on the circuit board 15 or the other circuit board or wiring board in place of the electronic circuit device shown in FIG. 15.

Since the electronic circuit device can be configured using as a filter the microminiature and low-height surface acoustic wave device, it is feasible to miniaturize the electronic circuit device.

As described in the foregoing, according to the surface acoustic wave device 1 in the present invention, the excitation electrodes 5 and the signal electrodes 6 which constitute the plurality of surface acoustic wave elements having passbands of different frequencies and the first annular electrodes 27a and 27b surrounding the surface acoustic wave element electrodes are provided on the piezoelectric substrate 3, thereby making the microminiature and low-height surface acoustic wave device 1 feasible.

Since the first annular electrodes 27a and 27b are formed so as to individually surround each of the plurality of surface acoustic wave elements, the plurality of surface acoustic wave elements having passbands of different frequencies can be incorporated into one piezoelectric substrate with mutual isolation properties kept good, and particularly a suitable surface acoustic wave device can be realized in a duplexer. Further, hermeticity and moisture resistance can be sufficiently ensured, thereby making it possible to provide a surface acoustic wave device being superior in long-term reliability.

One main surface of the piezoelectric substrate 3 provided with the excitation electrode 5, the signal electrode 6, and the first annular electrodes 27a and 27b is opposed to the upper surface of the mounting base member 2, and the signal electrode 6 and the first annular electrodes 27a and 27b on the piezoelectric substrate 3 are connected to the signal electrode 30 and the second annular electrodes 28a and 28b on the mounting base member 2 formed so as to be wider than the electrodes. Therefore, the effective thicknesses of connections thereamong are increased, thereby making it possible to provide the surface acoustic wave device 1 superior in hermeticity and moisture resistance.

The space S surrounded by the first annular electrodes 27a and 27b, the second annular electrodes 28a and 28b, the piezoelectric substrate 3, and the mounting base member 2 is filled with the inert gas, configured by opposing the piezoelectric substrate 3 and the mounting base member 2 which are provided with the surface acoustic wave electrodes, to hermetically seal the space S. When a relatively high power is applied to the surface acoustic wave element, therefore, a spark phenomenon which may appear in the signal electrode 6 can be prevented to the utmost. Further, the spark can be restrained with isolation properties kept good, thereby making it possible to provide the surface acoustic wave device being also superior in reliability.

The surface acoustic wave device is applicable to a duplexer having at least two filters which differ in passbands.

The surface acoustic wave device is applicable to a duplexer having at least two filters which differ in passbands, and does not contain a matching circuit between the two filters so that the mounting, area of the surface acoustic wave device can be reduced, thereby making it possible to provide a microminiature and low-height surface acoustic wave device having passbands of different frequencies.

The microminiature and low-height surface acoustic wave device and the electronic circuit device can be also realized by providing the mounting base member 2 and the circuit board 15 with the phase matching means for matching the phases of the plurality of surface acoustic wave elements.

Furthermore, it is possible to realize a highly sensitive and reliable and small-sized and low-height communication device including a high-frequency module comprising such a surface acoustic wave device.

The present invention is not limited to the above-mentioned embodiments. For example, the number of surface acoustic wave elements included in the surface acoustic wave device is not limited to two. For example, three or more surface acoustic wave elements may be included. In addition thereto, various modifications can be made within the scope of the present invention.

In the above description, the invention is exemplified with a surface acoustic wave device, however, the present invention can be adopted to any electronic device having a connecting terminal to electrically connecting to an outer circuit.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A surface acoustic wave device comprising:
   a base member;
   a piezoelectric substrate having a surface acoustic wave element electrode formed on its main surface,
   the piezoelectric substrate being configured by opposing the one main surface of the piezoelectric substrate to an upper surface of the base member;
   a recess having an opening on a lower surface of the base member;
   a conductor pattern formed from an inner wall surface of the recess to the lower surface of the base member and electrically connected to the surface acoustic wave element electrode through the inside of the base member; and an insulator for covering the conductor pattern inside of the recess and the lower surface of the base member around the recess so that a partial area of the conductor pattern that is not covered with the insulator is exposed on the lower surface of the base member.

2. The surface acoustic wave device according to claim 1, wherein the recess is a through hole penetrating between the upper surface and the lower surface of the base member.

3. The surface acoustic wave device according to claim 1, wherein the insulator is used to fill the recess so as to come into contact with a surface of the conductor pattern formed inside the recess.

4. An electronic circuit device wherein the surface acoustic wave device according to claim 1 is disposed on a circuit board, and the exposed partial area of the conductor pattern is joined to a connecting conductor formed on the circuit board.

5. The electronic circuit device according to claim 4, wherein the connecting conductor comprises a connecting pad and a solder formed on the connecting pad, and the insulator is interposed between the connecting pad and the conductor pattern in a state where the surface acoustic wave device is disposed on the circuit board.

6. The surface acoustic wave device according to claim 1, wherein the surface acoustic wave element electrode formed on the one main surface of the piezoelectric substrate comprises a plurality of surface acoustic wave element electrodes having passbands of different frequencies, a first annular electrode surrounding the plurality of surface acoustic wave element electrodes is provided on the one main surface of the piezoelectric substrate, and a second annular electrode joined to the first annular electrode is provided at a position, corresponding to the first annular electrode, on the upper surface of the base member, said second annular electrode being grounded.

7. The surface acoustic wave device according to claim 6, wherein the first annular electrode is formed so as to individually surround each of the plurality of surface acoustic wave element electrodes.

8. The surface acoustic wave device according to claim 1, wherein a first annular electrode surrounding the surface acoustic wave element electrodes is provided on the one main surface of the piezoelectric substrate, and a second annular electrode joined to the first annular electrode is provided at a position, corresponding to the first annular electrode, on the upper surface of the base member.

9. The surface acoustic wave device according to claim 8, wherein the second annular electrode is grounded.

10. The surface acoustic wave device according to claim 8, wherein the second annular electrode is formed so as to be wider than the first annular electrode.

11. The surface acoustic wave device according to claim 8, wherein an electrode joined to the signal electrode in the surface acoustic wave element provided on the one main surface of the piezoelectric substrate is provided on the upper surface of the base member, and the size of the electrode is made larger than the size of the signal electrode.

12. The surface acoustic wave device according to claim 8, wherein inert gas is put into a space surrounded by the one main surface of the piezoelectric substrate, the upper surface of the base member, the first annular electrode, and the second annular electrode, to hermetically seal the space.

13. The surface acoustic wave device according to claim 6, wherein the plurality of surface acoustic wave elements respectively compose filters of a duplexer.

14. An electronic circuit device wherein the surface acoustic wave device according to claim 1 is mounted on a circuit board.

15. The electronic circuit device according to claim 13, wherein phase matching means for matching the phases of signals passing through the plurality of surface acoustic wave elements is provided on the circuit board.

16. A communication device wherein the surface acoustic wave device according to claim 1 is used as a filter.

17. The surface acoustic wave device according to claim 1, wherein the insulator is composed of a solder resist.

18. A surface acoustic wave device comprising:

a base member;

a piezoelectric substrate having a surface acoustic wave element electrode formed on its main surface, the piezoelectric substrate being configured by opposing the one main surface of the piezoelectric substrate to an upper surface of the base member, wherein the surface acoustic wave element electrode formed on the one main surface of the piezoelectric substrate comprises a plurality of surface acoustic wave element electrodes having passbands of different frequencies, a first annular electrode, wherein the first annular electrode comprises a first annular electrode portion that surrounds a whole of the plurality of surface acoustic wave element electrodes; and a first separation electrode portion that is between individuals of the plurality of the surface acoustic wave element electrodes, wherein the first separation electrode portion together with the first annular electrode portion surround individuals of the plurality of the surface acoustic wave element electrodes, wherein the first annular electrode is provided on the one main surface of the piezoelectric substrate, a second annular electrode joined to the first annular electrode is provided at a position, corresponding to the first annular electrode, on the upper surface of the base member, said second annular electrode being grounded, wherein said second annular electrode comprises a second annular electrode portion and a second separation electrode portion, wherein said second separation electrode portion bisects said second annular electrode portion, and a closed space is formed by the first annular electrode, the second annular electrode, the one main surface of the piezoelectric substrate and the upper surface of the base member so as to surround a whole of the surface acoustic wave element electrodes and individually surround each of the surface acoustic wave element electrodes.

19. The surface acoustic wave device according to claim 18, wherein inert gas is put into the closed space.

20. The surface acoustic wave device according to claim 18, wherein the second annular electrode is formed so as to be wider than the first annular electrode.

21. The surface acoustic wave device according to claim 20, wherein an electrode joined to the signal electrode in the surface acoustic wave element provided on the one main surface of the piezoelectric substrate is provided on the upper surface of the base member, and the size of the electrode is made larger than the size of the signal electrode.

22. The surface acoustic wave device according to claim 18, wherein a side surface of the piezoelectric substrate is covered with protective material.

23. The surface acoustic wave device according to claim 18, wherein the plurality of surface acoustic wave elements respectively compose filters of a duplexer.

24. An electronic circuit device wherein the surface acoustic wave device according to claim 18 is mounted on a circuit board.

25. The electronic circuit device according to claim 24, wherein phase matching means for matching the phases of signals passing through the plurality of surface acoustic wave elements is provided on the circuit board.

26. A communication device wherein the surface acoustic wave device according to claim 18 is used as a filter.

27. An electronic device comprising:

a base member, and a substrate having an electronic element electrode formed on its main surface, the substrate being configured by opposing the one main surface of the substrate to an upper surface of the base member;

a recess having an opening on a lower surface of the base member;

a conductor pattern formed from an inner wall surface of the recess to the lower surface of the base member and electrically connected to the electronic element electrode; and an insulator for covering the conductor pattern so inside of the recess and the lower surface of the base member around the recess so that a partial area of the conductor pattern that is not covered with the insulator is exposed on the lower surface of the base member.

28. The electronic device according to claim 27, wherein the recess is a through hole penetrating between the upper surface and the lower surface of the base member.

29. The electronic device according to claim 27, wherein the insulator is used to fill the recess so as to come into contact with a surface of the conductor pattern formed inside the recess.

30. An electronic circuit device wherein the electronic device according to claim 27 is disposed on a circuit board, and the exposed partial area of the conductor pattern is joined to a connecting conductor formed on the circuit board.

31. The electronic circuit device according to claim 30, wherein the connecting conductor comprises a connecting pad and a solder formed on the connecting pad, and the insulator is interposed between the connecting pad and the conductor pattern in a state where the electronic device is disposed on the circuit board.

* * * * *